(12) United States Patent
Ando et al.

(10) Patent No.: US 7,948,234 B2
(45) Date of Patent: May 24, 2011

(54) MAGNETIC SENSOR AND METHOD FOR PRODUCING THE SAME

(75) Inventors: Hideto Ando, Niigata-ken (JP); Takashi Takabatake, Niigata-ken (JP); Tatsuya Saito, Niigata-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 12/838,890

(22) Filed: Jul. 19, 2010

(65) Prior Publication Data

US 2010/0283457 A1 Nov. 11, 2010

Related U.S. Application Data

(63) Continuation of application No. PCT/JP2009/050526, filed on Jan. 16, 2009.

(30) Foreign Application Priority Data

Jan. 24, 2008 (JP) ................................. 2008-013341

(51) Int. Cl.
*G01R 33/09* (2006.01)

(52) U.S. Cl. .................................. 324/252; 324/207.21

(58) Field of Classification Search ............ 324/207.21, 324/252; 257/421–427; 360/324–327, 313–316
See application file for complete search history.

(56) References Cited

U.S. PATENT DOCUMENTS 7,557,562 B2 * 7/2009 Myers et al. .............. 324/117 R

FOREIGN PATENT DOCUMENTS

| JP | 5-102321 | 4/1993 |
|---|---|---|
| JP | 2001-267654 | 9/2001 |
| JP | 2002-319110 | 10/2002 |
| JP | 2007-242989 | 9/2007 |
| JP | 2007-333587 | 12/2007 |

OTHER PUBLICATIONS

International Search Report issued in corresponding PCT Application No. PCT/JP2009/050526; mailed Mar. 24, 2009.

* cited by examiner

*Primary Examiner* — Bot L LeDynh
(74) *Attorney, Agent, or Firm* — Brinks Hofer Gilson & Lione

(57) ABSTRACT

A magnetoresistive element includes, in plan view, an element section and an extension region extending from an end portion of the element section; and an insulation layer is formed on the element section and the extension region. A contact hole having a recessed shape, penetrating through the insulation layer, and extending at least to the extension region is formed; an electrode pad is formed in the contact hole; a surface of the electrode pad is exposed to outside; and the electrode pad is electrically connected to the extension region. The element section and the extension region are integrally formed so as to have an identical layer configuration employing a magnetoresistive effect in which electrical resistance varies in response to external magnetic fields.

7 Claims, 10 Drawing Sheets

MAGNETIC SENSOR AND METHOD FOR PRODUCING THE SAME

CLAIM OF PRIORITY

This application is a Continuation of International Application No. PCT/JP2009/050526 filed on Jan. 16, 2009, which claims benefit of Japanese Patent Application No. 2008-013341 filed on Jan. 24, 2008. The entire contents of each application noted above are hereby incorporated by reference.

BACKGROUND OF THE INVENTION

1. Field of the Invention

The present invention relates to a magnetic sensor in which the connection between an electrode pad and an element section can be stabilized and the production process of the magnetic sensor can be simplified; and a method for producing such a magnetic sensor.

2. Description of the Related Art

A magnetic sensor including a magnetoresistive element is used as, for example, a geomagnetic sensor or an open/close detecting sensor. The electrical resistance of such a magnetoresistive element varies in response to the intensity of external magnetic fields.

FIGS. 12A to 14B illustrate steps of a method for producing an existing magnetic sensor. FIGS. 12A, 13A, and 14A are plan views of the magnetic sensor. FIGS. 12B, 13B, and 14B are sections taken along line XIIB-XIIB illustrated in FIG. 12A and lines corresponding to line XIIB-XIIB in the height direction and viewed in the direction of arrows illustrated in FIG. 12A.

In the step illustrated in FIGS. 12A and 12B, element sections 54 constituting magnetoresistive elements 52 and 53 are formed on an insulation layer 51 formed on a substrate 50, such that the element sections 54 have a meandering shape. For example, the element sections 54 are formed so as to have a multilayer structure constituting a giant magnetoresistive element (GMR element).

Then, in the step illustrated in FIGS. 13A and 13B, electrode layers 55 electrically connected to the two longitudinal ends of each element section 54 are formed so as to extend from the two ends of the element section 54 toward the outside. The electrode layers 55 are formed of a good conductor such as Au or Cu. The film thickness of the element sections 54 is several hundred angstroms. However, the electrode layers 55 can be formed so as to have a film thickness sufficiently larger than the film thickness of the element sections 54.

Then, an insulation layer 56 is formed on the element sections 54, the electrode layers 55, and the insulation layer 51. Contact holes 57 having a recessed shape are formed by etching or the like in the insulation layer 56 positioned on the electrode layers 55.

Then, as illustrated in FIGS. 14A and 14B, electrode pads 58 are formed in the contact holes 57 by plating Au to electrically connect the electrode pads 58 to the electrode layers 55.

As described above, the electrode layers 55 have been formed in an independent step so as to extend from the element sections 54 constituting the magnetoresistive elements 52 and 53. In this case, the element width of the element sections 54 is very small value of about several micrometers and the width between the element sections is also very small. Thus, alignment with high accuracy is required for forming the electrode layers 55 and the formation of the electrode layers 55 at a position deviated with respect to the element sections 54 tends to cause instability of the electrical connection between the electrode layers 55 and the element sections 54.

In addition, the step of forming the electrode layers 55 has been performed as a step independent from the step of forming the element sections 54, which increases the number of steps. In this case, additional material is required for forming the electrode layers 55, which increases the production costs.

Japanese Unexamined Patent Application Publication Nos. 2007-242989 and 2002-319110 are examples of related art.

SUMMARY OF THE INVENTION

The present invention provides a magnetic sensor in which the connection between an electrode pad and an element section can be stabilized and the production process of the magnetic sensor can be simplified; and a method for producing such a magnetic sensor.

The present invention provides a magnetic sensor including a magnetoresistive element, wherein the magnetoresistive element includes, in plan view, an element section and an extension region extending from an end portion of the element section; and an insulation layer is formed on the element section and the extension region;

a contact hole having a recessed shape, penetrating through the insulation layer, and extending at least to the extension region is formed; an electrode pad is formed in the contact hole; a surface of the electrode pad is exposed to outside; and the electrode pad is electrically connected to the extension region; and the element section and the extension region are integrally formed so as to have an identical multilayer configuration employing a magnetoresistive effect in which electrical resistance varies in response to external magnetic fields. In such a magnetic sensor, the connection between the electrode pad and the element section can be stabilized compared with existing techniques.

The present invention also provides a magnetic sensor including a magnetoresistive element employing a magnetoresistive effect in which electrical resistance varies in response to external magnetic fields; and a fixed resistance element in which electrical resistance does not vary in response to external magnetic fields, the fixed resistance element being connected in series to the magnetoresistive element via an output extracting section, wherein the magnetoresistive element and the fixed resistance element each include, in plan view, an element section and an extension region extending from an end portion of the element section; and an insulation layer is formed on the element section and the extension region; and in at least one of the magnetoresistive element and the fixed resistance element, the element section and the extension region are integrally formed so as to have an identical layer configuration; a contact hole having a recessed shape, penetrating through the insulation layer, and extending at least to the extension region is formed; an electrode pad is formed in the contact hole; a surface of the electrode pad is exposed to outside; and the electrode pad is electrically connected to the extension region. In such a magnetic sensor, the connection between the electrode pad and the element section can be stabilized compared with existing techniques.

According to the present invention, the element section is preferably formed so as to have a meandering shape. In this case, the element resistance of the element section can be increased and the parasitic resistance of the extension region can be relatively decreased.

According to the present invention, a tip portion of the extension region is preferably formed so as to surround the contact hole; and an inner side surface of the extension region is preferably electrically connected to a side surface of the electrode pad formed in the contact hole. In this case, the connection between the electrode pad and the element section can be stabilized more effectively.

According to the present invention, the following configuration may be employed: the contact hole formed in the magnetoresistive element does not penetrate through the extension region; and, under the contact hole, a portion of the extension region is left in which at least a magnetic sensitive layer whose magnetization varies in response to external magnetic fields has been removed.

The present invention also provides a method for producing a magnetic sensor including a magnetoresistive element, the method including the steps of:

forming the magnetoresistive element so as to include, in plan view, an element section and an extension region extending from an end portion of the element section; the element section and the extension region being integrally formed so as to have an identical multilayer configuration employing a magnetoresistive effect in which electrical resistance varies in response to external magnetic fields;

forming an insulation layer on the element section and the extension region;

forming a contact hole having a recessed shape, penetrating through the insulation layer, and extending at least to the extension region; and forming an electrode pad in the contact hole such that a surface of the electrode pad is exposed to outside and the electrode pad is electrically connected to the extension region.

In such a method for producing a magnetic sensor according to the present invention, a step of forming an electrode layer so as to extend from the element section, the step being independent from a step of forming the element section, is not necessary. Thus, the production process can be simplified and the production costs can be reduced. In addition, the connection between the electrode pad and the element section can be stabilized compared with existing techniques.

The present invention also provides a method for producing a magnetic sensor including a magnetoresistive element employing a magnetoresistive effect in which electrical resistance varies in response to external magnetic fields; and a fixed resistance element in which electrical resistance does not vary in response to external magnetic fields, the fixed resistance element being connected in series to the magnetoresistive element via an output extracting section, the method including the steps of:

forming each of the magnetoresistive element and the fixed resistance element so as to include, in plan view, an element section and an extension region extending from an end portion of the element section; in at least one of the magnetoresistive element and the fixed resistance element, the element section and the extension region being integrally formed so as to have an identical layer configuration;

forming an insulation layer on the element section and the extension region;

forming, in the element including the element section and the extension region that are integrally formed so as to have the identical layer configuration, a contact hole having a recessed shape, penetrating through the insulation layer, and extending at least to the extension region; and forming an electrode pad in the contact hole such that a surface of the electrode pad is exposed to outside and the electrode pad is electrically connected to the extension region.

In such a method for producing a magnetic sensor according to the present invention, a step of forming an electrode layer so as to extend from the element section, the step being independent from a step of forming the element section, is not necessary. Thus, the production process can be simplified and the production costs can be reduced. In addition, the connection between the electrode pad and the element section can be stabilized compared with existing techniques.

According to the present invention, the element section is preferably formed so as to have a meandering shape.

According to the present invention, an electrode section having a larger width than the extension region is preferably formed at a tip of the extension region; and the contact hole is preferably formed within a region of the electrode section such that a portion of the electrode section is left around the contact hole to electrically connect a side surface of the electrode pad formed in the contact hole to an inner side surface of the electrode section. In this case, the connection between the electrode pad and the element section can be further stabilized effectively compared with existing techniques.

DESCRIPTION OF THE PREFERRED EMBODIMENTS

Figure 1:
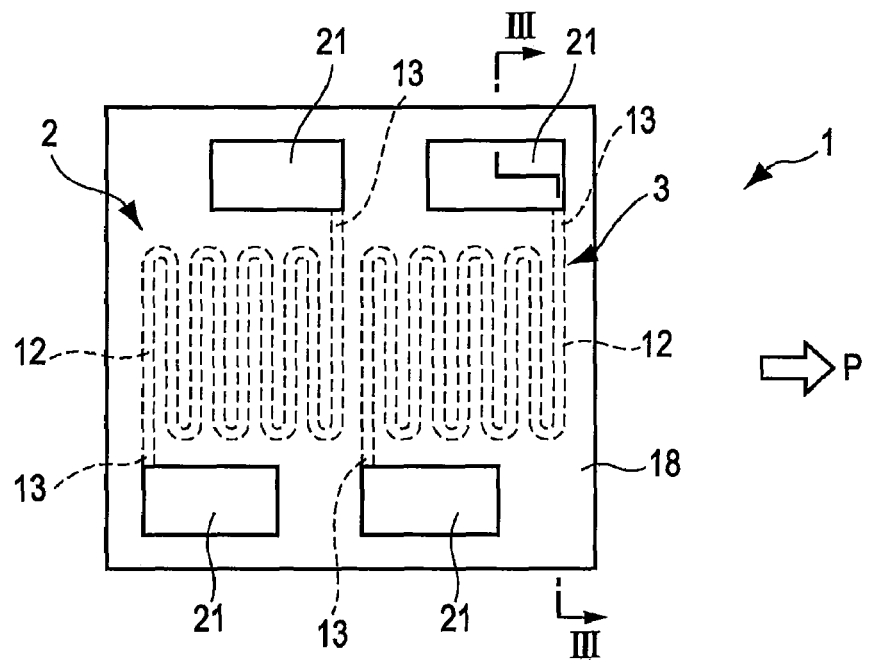
FIG. 1 is a plan view illustrating a magnetic sensor according to an embodiment, in particular, a portion of the magnetic sensor corresponding to magnetoresistive elements.
Figure 2:
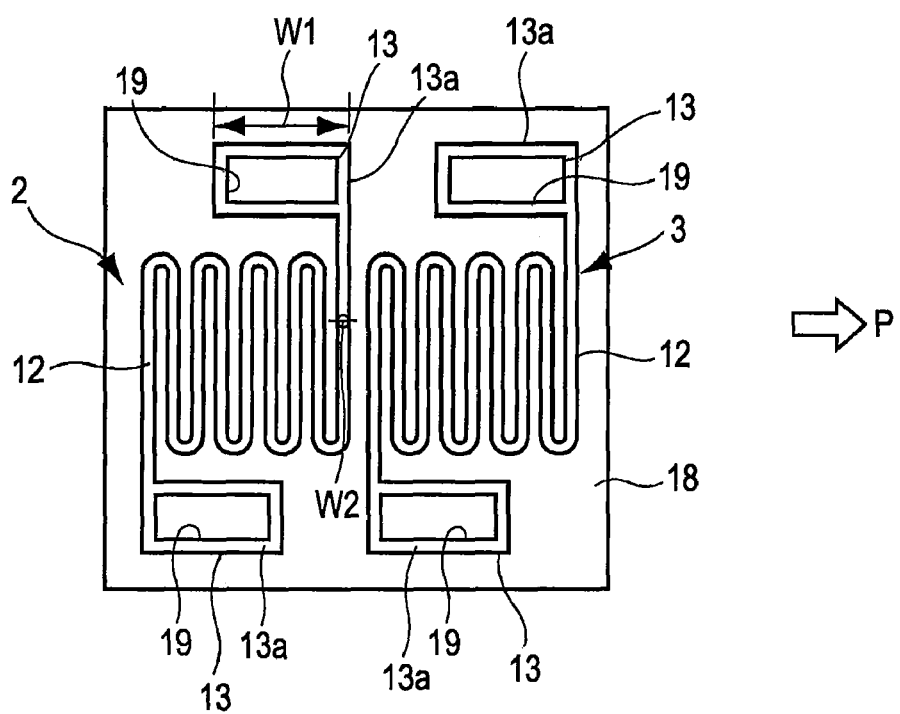
FIG. 2 is a plan view of the portion corresponding to the magnetoresistive elements in the state in which electrode pads and an insulation layer have been removed from the configuration illustrated in FIG. 1.
Figure 3:
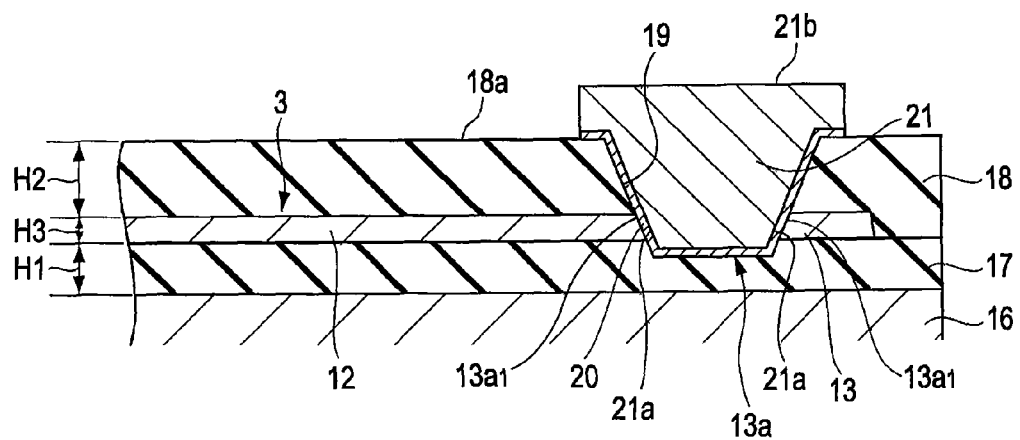
FIG. 3 is a partial enlarged section of the magnetic sensor, the section being taken along line illustrated in FIG. 1 in the height direction and viewed in the direction of arrows illustrated in FIG. 1.
Figure 4:
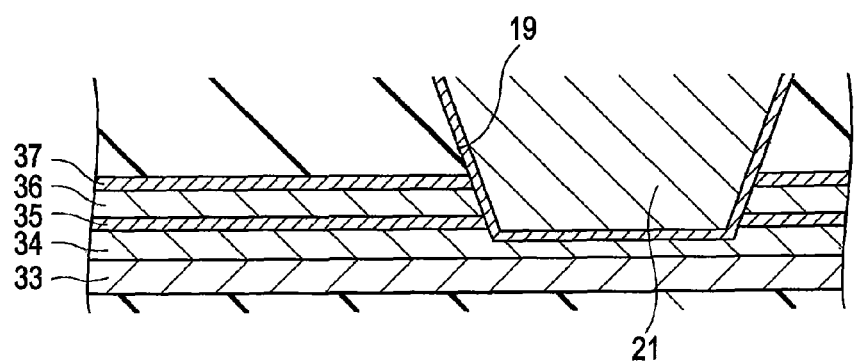
FIG. 4 is a partial enlarged section of a magnetic sensor having a configuration that is different from the configuration illustrated in FIG. 3.
Figure 5:
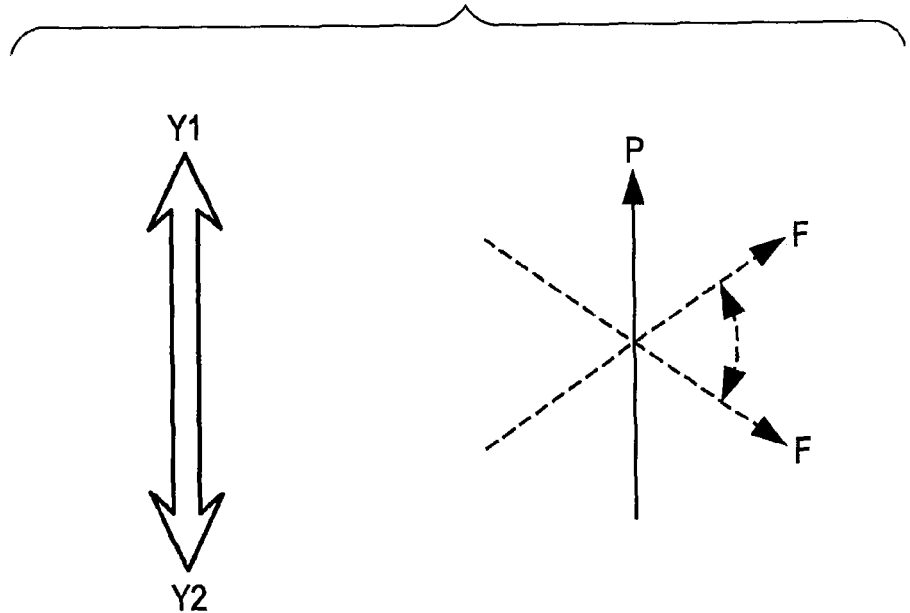
FIG. 5 is a diagram for illustrating the relationship between electrical resistance and the pinned magnetization direction of a pinned magnetic layer and the magnetization direction of a free magnetic layer of a magnetoresistive element.
Figure 6:
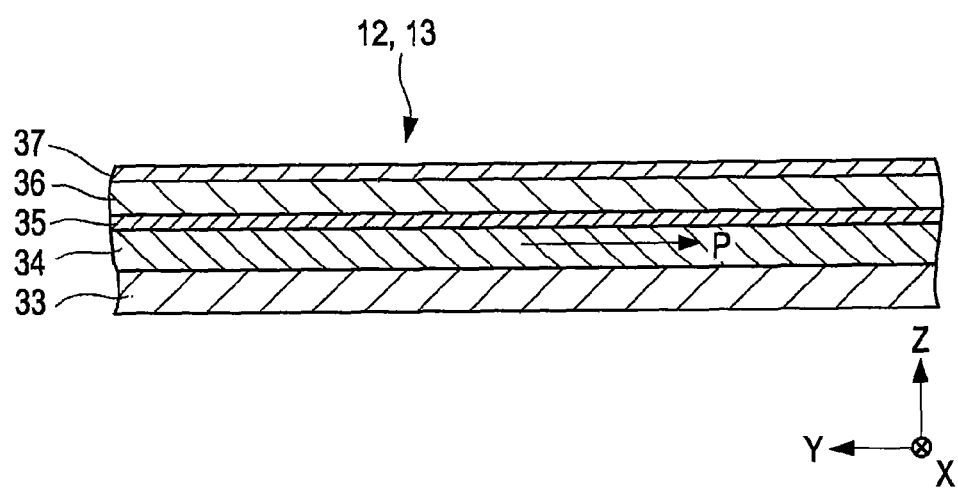
FIG. 6 is a sectional view illustrating a section of a magnetoresistive element cut in the film thickness direction.
Figure 7:
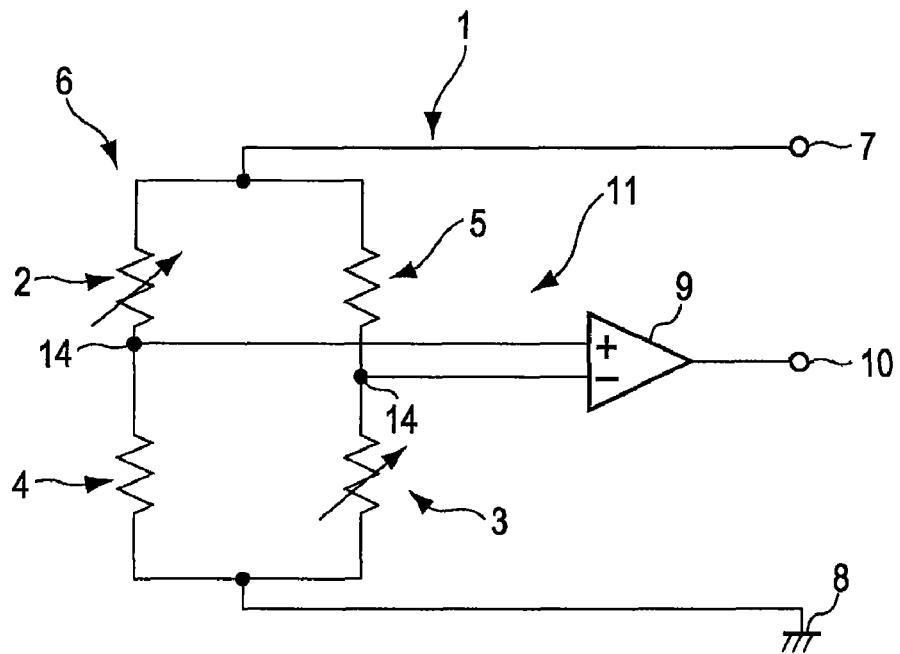
FIG. 7 is a circuit diagram of the magnetic sensor of the embodiment.
Figure 8:
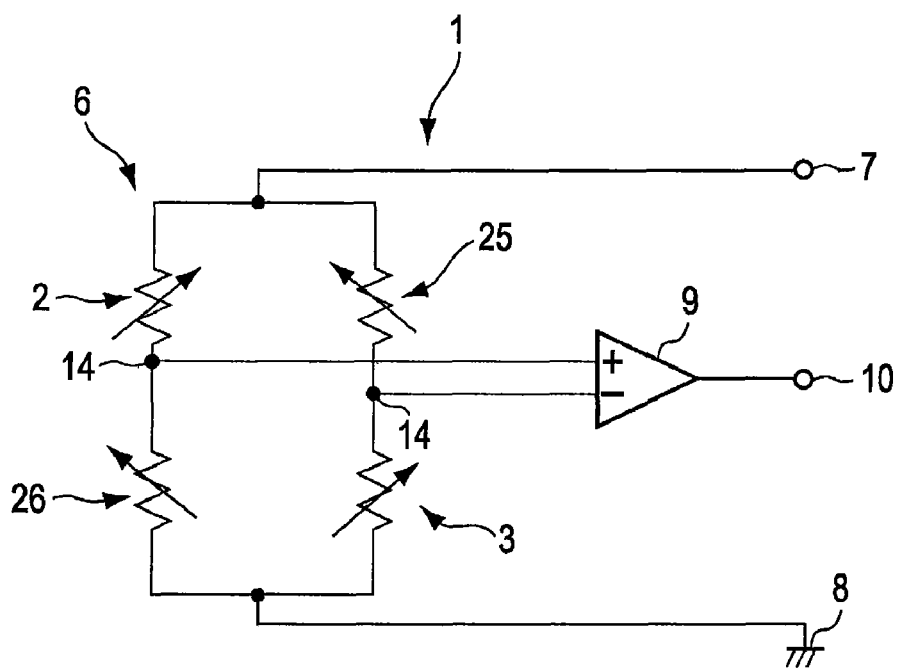
FIG. 8 is a circuit diagram of another magnetic sensor different from that illustrated in FIG. 7.

FIG. 1 is a plan view illustrating a magnetic sensor according to an embodiment, in particular, a portion of the magnetic sensor corresponding to magnetoresistive elements. FIG. 2 is a plan view of the portion corresponding to the magnetoresistive elements in the state in which electrode pads and an insulation layer have been removed from the configuration illustrated in FIG. 1. FIG. 3 is a partial enlarged section of the magnetic sensor, the section being taken along line illustrated in FIG. 1 in the height direction and viewed in the direction of arrows illustrated in FIG. 1. FIG. 4 is a partial enlarged section of a magnetic sensor having a configuration that is different from the configuration illustrated in FIG. 3. FIG. 5 is a diagram for illustrating the relationship between electrical resistance and the pinned magnetization direction of a pinned magnetic layer and the magnetization direction of a free magnetic layer of a magnetoresistive element. FIG. 6 is a sectional view illustrating a section of a magnetoresistive element cut in the film thickness direction. FIG. 7 is a circuit diagram of the magnetic sensor of the embodiment. FIG. 8 is a circuit diagram of another magnetic sensor different from that illustrated in FIG. 7.

A magnetic sensor 1 including a magnetoresistive element according to the present embodiment is used as, for example, a geomagnetic sensor incorporated into a portable device such as a cellular phone or an open/close detecting sensor.

Referring to FIG. 7, the magnetic sensor 1 includes a sensor section 6 in which magnetoresistive elements 2 and 3 and fixed resistance elements 4 and 5 are arranged in a bridge connection; and an integrated circuit (IC) 11 including an input terminal 7 electrically connected to the sensor section 6, a ground terminal 8, a differential amplifier 9, an external output terminal 10, and the like.

Referring to FIG. 3, the magnetoresistive elements 2 and 3 are formed on a substrate 16 with an insulation layer 17 provided between the magnetoresistive elements 2 and 3 and the substrate 16. The insulation layer 17 is composed of Al2O3, SiO2, SiN, or the like. The insulation layer 17 has a film thickness H1 of about 1,000 to 20,000 Å. The insulation layer 17 is formed by, for example, sputtering.

Referring to FIGS. 1 and 2, the magnetoresistive elements 2 and 3 each include an element section 12 and extension regions 13 extending from the two ends of the element section 12, the two ends being in the longitudinal direction of the element section 12. The magnetoresistive elements 2 and 3 are formed by sputtering or the like. The element sections 12 and the extension regions 13 have a film thickness H3 of about 200 to 500 Å. As illustrated in FIGS. 1 and 2, the element sections 12 are formed so as to have a meandering shape so that the length of the elements becomes large. As illustrated in FIG. 2, the extension regions 13 extend in the form of a strip (wiring section) having a width equivalent to an element width W2 from the end portions of the element sections 12 toward the outside; and, at the tip portions of the wiring sections, form electrode sections 13a in which a width W1 between outer side surfaces is large compared with the element width W2. The element width W2 is about 2 to 30 □m and the width W1 of the electrode sections 13a is about 5 to 50 □m.

As illustrated in FIGS. 1 and 3, an insulation layer 18 is formed on the element sections 12 and the extension regions 13. The insulation layer 18 is also formed so as to overlap the insulation layer 17 around the element sections 12 and the extension regions 13. The insulation layer 18 is composed of Al2O3, SiO2, SiN, or the like. The insulation layer 18 has a film thickness H2 of about 1,000 to 20,000 Å. The insulation layer 18 is formed by, for example, sputtering.

As illustrated in FIGS. 2 and 3, contact holes 19 having a recessed shape and continuously penetrating through the insulation layer 18 and the electrode sections 13a of the extension regions 13 are formed. The contact holes 19 are formed by ion milling (etching). As illustrated in FIG. 3, the contact holes 19 are substantially formed at the centers of the electrode sections 13a of the extension regions 13. Thus, the electrode sections 13a are shaped so as to surround the contact holes 19.

As illustrated in FIG. 3, a seed layer 20 is formed on the insulation layer 18 constituting the contact hole 19, the inner side surfaces of the electrode section 13a, and the surface of the insulation layer 17 exposed through the contact hole 19. An electrode pad 21 is formed by plating on the seed layer 20. The electrode pad 21 is formed of Au, Al, or the like. The electrode pad 21 is formed in the contact hole 19 such that side surfaces 21a of the electrode pad 21 are electrically connected to inner side surfaces 13a1 of the electrode section 13a. A top surface 21b of the electrode pad 21 is an exposed surface that protrudes upward compared with a top surface 18a of the insulation layer 18. The top surface 21b serves as a wire bonding surface to an external circuit (not shown).

The magnetic sensor 1 of the present embodiment has features in that the element sections 12 and the extension regions 13 are integrally formed so as to have an identical layer configuration employing the magnetoresistive effect in which electrical resistance varies in response to external magnetic fields; and the contact holes 19 having a recessed shape and continuously penetrating through the insulation layer 18 and the extension regions 13 are formed, the electrode pads 21 are formed in the contact holes 19, and the electrode pads 21 are electrically connected to the extension regions 13.

The element sections 12 and the extension regions 13 have a multilayer structure illustrated in FIG. 6. FIG. 6 illustrates a section taken in a direction parallel to the element width W2 and in the film thickness direction.

For example, each element section 12 and each extension region 13 have a structure in which, in ascending order, an antiferromagnetic layer 33, a pinned magnetic layer 34, a nonmagnetic layer 35, and a free magnetic layer 36 are sequentially stacked; and the surface of the free magnetic layer 36 is covered with a protective layer 37.

The antiferromagnetic layer 33 is formed of an antiferromagnetic material such as an Ir—Mn alloy (iridium-manganese alloy) or a Pt—Mn alloy (platinum-manganese alloy). The pinned magnetic layer 34 is formed of a soft magnetic material such as a Co—Fe alloy (cobalt-iron alloy). The nonmagnetic layer 35 is formed of Cu (copper) or the like. The free magnetic layer 36 is formed of a soft magnetic material such as a Ni—Fe alloy (nickel-iron alloy). The protective layer 37 is formed of Ta (tantalum) or the like. An element having the above-described structure including the nonmagnetic layer 35 formed of a nonmagnetic conductive material such as Cu serves as a giant magnetoresistive element (GMR element). Alternatively, an element serving as a tunneling magnetoresistive element (TMR element) may be employed in which the nonmagnetic layer 35 is formed of an insulation material such as Al2O3. Alternatively, an element serving as an anisotropic magnetoresistive element (AMR element) employing an anisotropic magnetoresistive effect (AMR effect) may be employed. The multilayer structure illustrated in FIG. 6 is a mere example and another multilayer structure may also be employed. For example, a structure in which, in ascending order, the free magnetic layer 36, the nonmagnetic layer 35, the pinned magnetic layer 34, the antiferromagnetic layer 33, and the protective layer 37 are sequentially stacked may be employed.

The direction of magnetization of the pinned magnetic layer 34 is pinned by antiferromagnetic coupling between the antiferromagnetic layer 33 and the pinned magnetic layer 34.

As illustrated in FIGS. 1, 2, and 6, the pinned magnetization direction (direction P) of the pinned magnetic layer 34 is oriented in the direction of the width of the elements. That is, the pinned magnetization direction (direction P) of the pinned magnetic layer 34 is orthogonal to the longitudinal direction of the element sections 12.

In contrast, the magnetization direction (direction F) of the free magnetic layer 36 varies in accordance with external magnetic fields.

As illustrated in FIG. 5, when an external magnetic field Y1 in the same direction as the pinned magnetization direction (direction P) of the pinned magnetic layer 34 influences the free magnetic layer 36, the magnetization direction (direction F) of the free magnetic layer 36 is oriented in the direction of the external magnetic field Y1. In this case, the pinned magnetization direction (direction P) of the pinned magnetic layer 34 and the magnetization direction (direction F) of the free magnetic layer 36 are nearly parallel to each other and the electrical resistance is decreased.

In contrast, as also illustrated in FIG. 5, when an external magnetic field Y2 in a direction opposite the pinned magnetization direction (direction P) of the pinned magnetic layer 34 influences the free magnetic layer 36, the magnetization direction (direction F) of the free magnetic layer 36 is oriented in the direction of the external magnetic field Y2. In this case, the pinned magnetization direction (direction P) of the pinned magnetic layer 34 and the magnetization direction (direction F) of the free magnetic layer 36 are nearly antiparallel to each other and the electrical resistance is increased.

In the present embodiment, as described above, the element sections 12 and the extension regions 13 are integrally formed so as to have an identical layer configuration illustrated in FIG. 6; and the contact holes 19 having a recessed shape and continuously penetrating through the insulation layer 18 and the extension regions 13 are formed, and the electrode pads 21 formed in the contact holes 19 are electrically connected to the extension regions 13. Accordingly, the connection between the electrode pads 21 and the element sections 12 can be stabilized compared with existing techniques in which the element sections 12 and electrode layers extending from ends of the element sections 12 are separately formed. As described above, the element width W2 of the element sections 12 and the width between the element sections are very small. Thus, when existing techniques in which an independent step of connecting electrode layers to the element sections 12 is preformed are employed, alignment with high accuracy is required and even a slight deviation of electrode layers disposed with respect to the element sections 12 tends to cause instability of the connection between the electrode layers and the element sections 12. In contrast, in the present embodiment, since the element sections 12 and the extension regions 13 are integrally formed, such a problem in the existing techniques does not occur. Furthermore, in the present embodiment, the contact holes 19 having a recessed shape and continuously penetrating through the insulation layer 18 and the extension regions 13 are formed. As described above, since the extension regions 13 have the same layer configuration as the element sections 12, the film thickness H3 of the extension regions 13 is very small compared with the film thickness H2 of the insulation layer 18 formed on the extension regions 13. Accordingly, when etching of the insulation layer 18 and the extension regions 13 for forming the contact holes 19 is not appropriately controlled, the etching may be terminated within the insulation layer 18 before the extension regions 13 are etched. Thus, in the present embodiment, overetching is performed to form the contact holes 19 having a recessed shape and continuously penetrating through the insulation layer 18 and the extension regions 13. At this time, as illustrated in FIG. 2, when each electrode section 13a is formed so as to surround the contact hole 19, the following advantage is provided. When the electrode pad 21 is formed so as to fill the contact hole 19, the contact area between the electrode pad 21 and the extension region 13 (electrode section 13a) can be made large and hence the connection between the electrode pad 21 and the extension region 13 (electrode section 13a) can be stabilized.

Compared with the existing techniques in which electrode layers are formed of a good conductor so as to extend from element sections, in the present embodiment in which the extension regions 13 are formed so as to have the same layer configuration as the element sections 12, the parasitic resistance of the extension regions 13 tends to increase. However, as illustrated in FIGS. 1 and 2, the element sections 12 have a meandering shape and hence have a very large element length. Thus, the resistance of the element sections 12 is extremely high compared with the resistance of the extension regions 13. For example, the resistance of the element sections 12 is several kilohms, whereas the resistance of the extension regions 13 is several ohms to several tens of ohms and the parasitic resistance of the extension regions 13 is relatively small. Accordingly, an increase in the parasitic resistance of the extension regions 13 caused by the formation of the extension regions 13 having the same layer configuration as the element sections 12 scarcely causes adverse effects such as degradation of characteristics. The above-described feature configuration of the magnetic sensor 1 of the present embodiment can be effectively applied to cases, as illustrated in FIGS. 1 and 3, where the electrode pads 21 are disposed relatively near the magnetoresistive elements 2 and 3 and the wiring from the magnetoresistive elements 2 and 3 to the electrode pads 21 is relatively simple and short.

As described above, for both object embodiments and production processes, the contact holes 19 are preferably formed so as to have a recessed shape and to penetrate through the electrode sections 13a of the extension regions 13. However, the present embodiment does not exclude embodiments in which etching of the extension regions 13 is terminated in an intermediate layer of the extension regions 13. For example, in the present embodiment, as illustrated in FIG. 4, the structure in which, under the contact hole 19, at least the free magnetic layer (magnetic sensitive layer) 36 whose magnetization varies in response to external magnetic fields is removed from the extension region 13 and a portion of the extension region 13 is left may also be employed. As described above, the parasitic resistance of the extension regions 13 is relatively very small. However, in the case where etching of the extension regions 13 is terminated in an intermediate layer of the extension regions 13, when the free magnetic layer 36 whose magnetization varies is removed for the purpose of eliminating magnetic sensitivity, output characteristics can be stabilized and reliability can be enhanced.

The configuration of the magnetoresistive elements 2 and 3 has been described above. In the present embodiment, the fixed resistance elements 4 and 5 connected in series to the magnetoresistive elements 2 and 3 via output extracting sections 14 may be made to have a configuration similar to the configuration of the magnetoresistive elements 2 and 3 illustrated in FIGS. 1 to 3. Specifically, the element sections 12 and the extension regions 13 illustrated in FIGS. 1 to 3 may be integrally formed so as to have a layer configuration of a fixed resistance element. The layer configuration of the fixed resistance elements 4 and 5 is not particularly restricted. However, to make the fixed resistance elements 4 and 5 have a temperature coefficient of resistance (TCR) similar to that of the magnetoresistive elements 2 and 3, the layers of the magnetoresistive elements 2 and 3 are preferably used for the fixed resistance elements 4 and 5 though the stacking order of the layers are different from that of the magnetoresistive elements 2 and 3. For example, in the element sections 12 and the extension regions 13 constituting the fixed resistance elements 4 and 5, in ascending order, the antiferromagnetic layer 33, the pinned magnetic layer 34, the free magnetic layer 36, the nonmagnetic layer 35, and the protective layer 37 are sequentially stacked. As a result, the free magnetic layer 36 directly stacked on the pinned magnetic layer 34 has become a magnetic layer whose magnetization no longer varies in response to external magnetic fields and is pinned. Thus, the resistance can be fixed and the difference in the temperature coefficient of resistance (TCR) between the fixed resistance elements 4 and 5 and the magnetoresistive elements 2 and 3 can be decreased.

Alternatively, only the fixed resistance elements 4 and 5 may be made to have the configuration illustrated in FIGS. 1 to 3. However, it is preferred that both the magnetoresistive elements 2 and 3 and the fixed resistance elements 4 and 5 be made to have the configuration illustrated in FIGS. 1 to 3.

In the embodiment illustrated in FIG. 7, the magnetoresistive elements 2 and 3 and the fixed resistance elements 4 and 5 constitute a bridge circuit. Alternatively, for example, in an embodiment illustrated in FIG. 8, four magnetoresistive elements 2, 3, 25, and 26 constitute a bridge circuit. For example, the pinned magnetization direction (direction P) of the pinned magnetic layers 34 of the magnetoresistive elements 2 and 3 is antiparallel to the pinned magnetization direction (direction P) of the pinned magnetic layers 34 of the magnetoresistive elements 25 and 26. In the embodiment illustrated in FIG. 8, the magnetoresistive elements 2, 3, 25, and 26 are preferably formed so as to have the configuration illustrated in FIGS. 1 to 3.

Figure 9A:
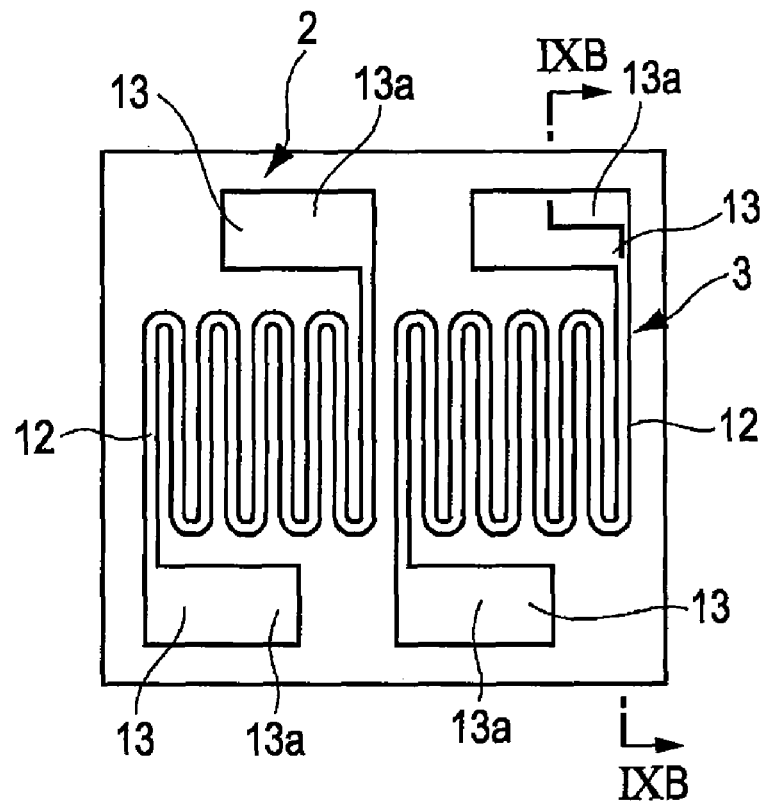
FIGS. 9A and 9B illustrate a step of a method for producing the magnetic sensor of the embodiment.
Figure 9B:
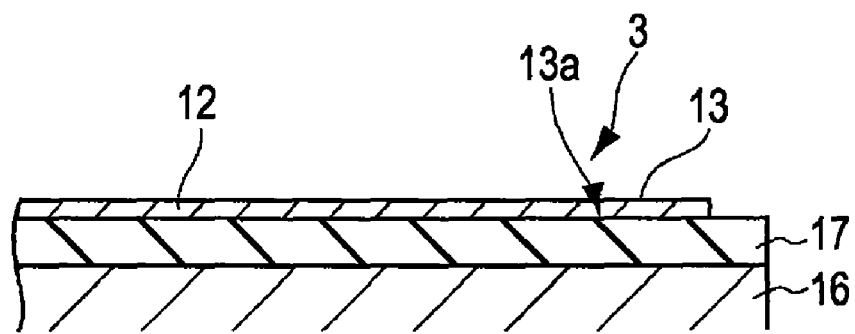
Figure 10A:
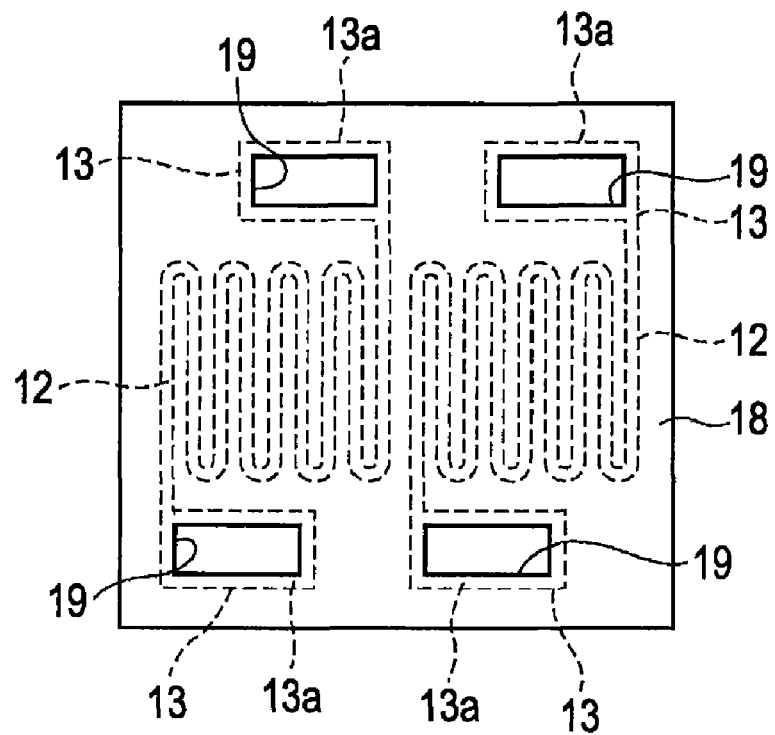
FIGS. 10A and 10B illustrate a step performed after the step illustrated in FIGS. 9A and 9B.
Figure 10B:
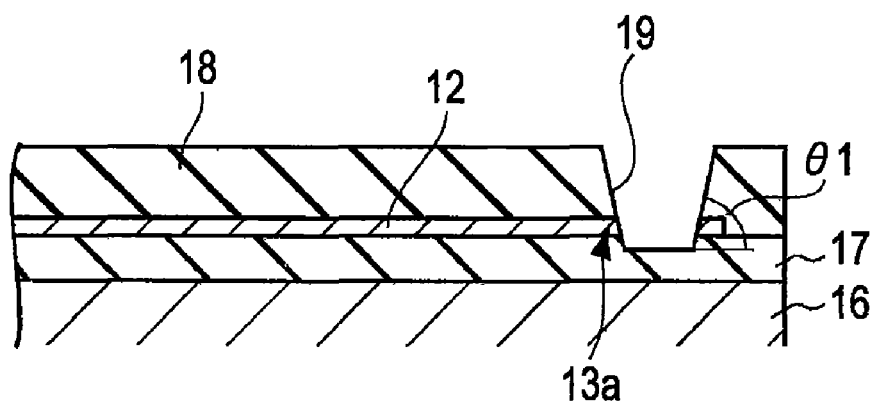
Figure 11A:
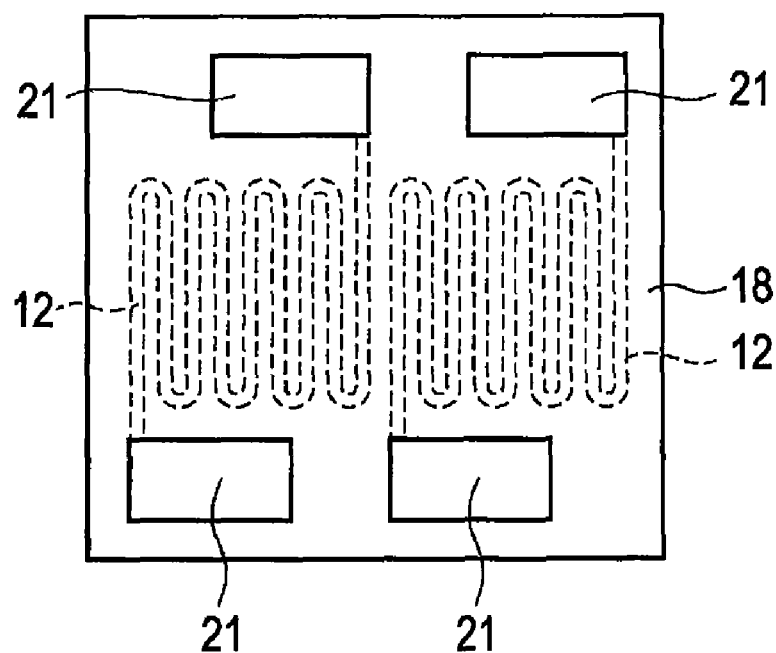
FIGS. 11A and 11B illustrate a step performed after the step illustrated in FIGS. 10A and 10B.
Figure 11B:
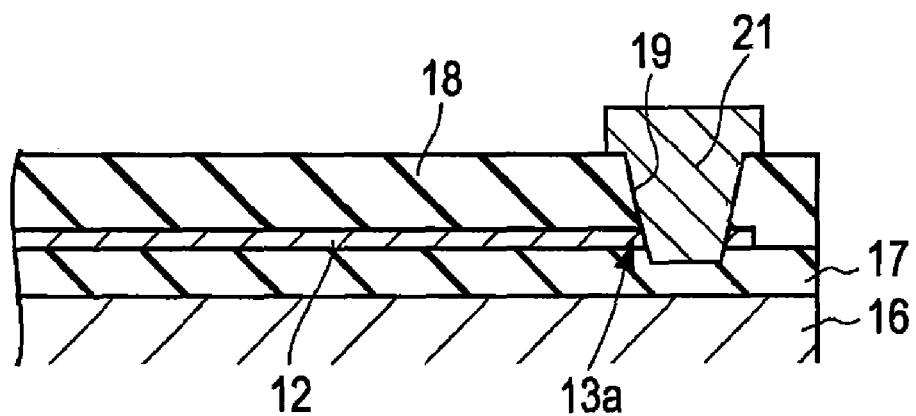
Figure 12A:
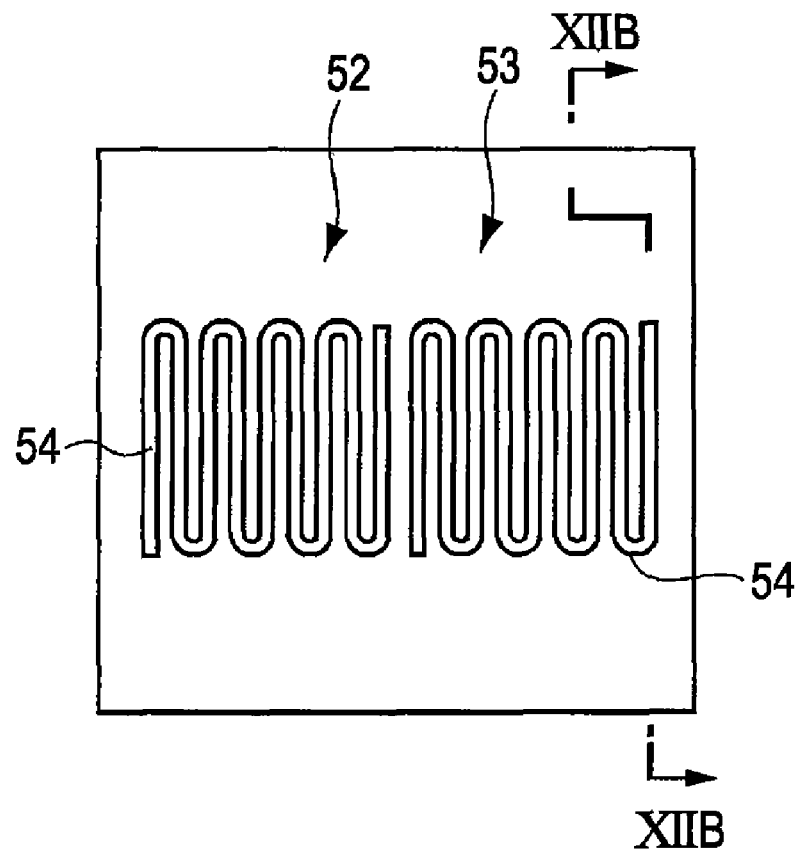
FIGS. 12A and 12B illustrate a step of a method for producing an existing magnetic sensor.
Figure 12B:
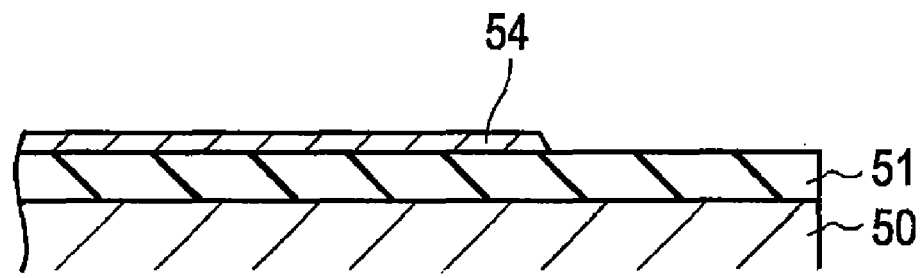
Figure 13A:
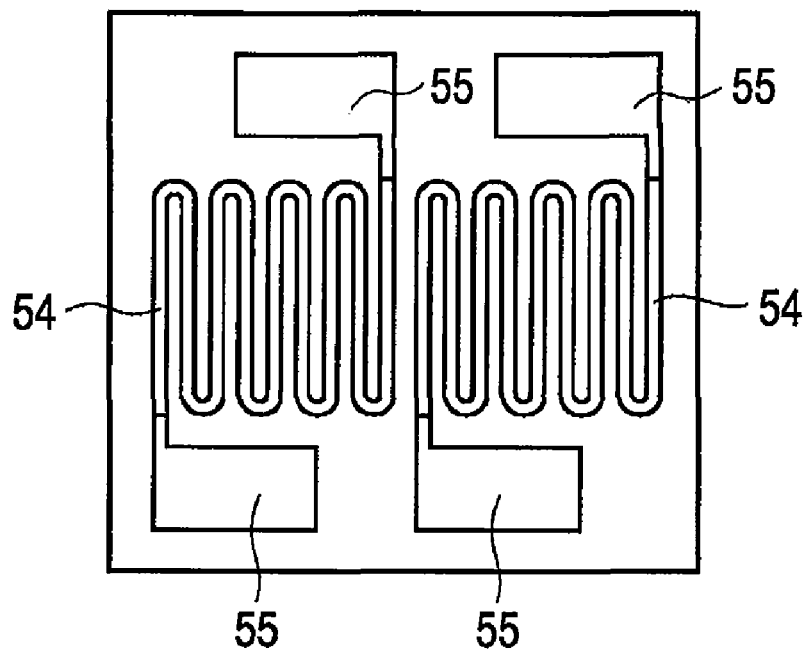
FIGS. 13A and 13B illustrate a step performed after the step illustrated in FIGS. 12A and 12B.
Figure 13B:
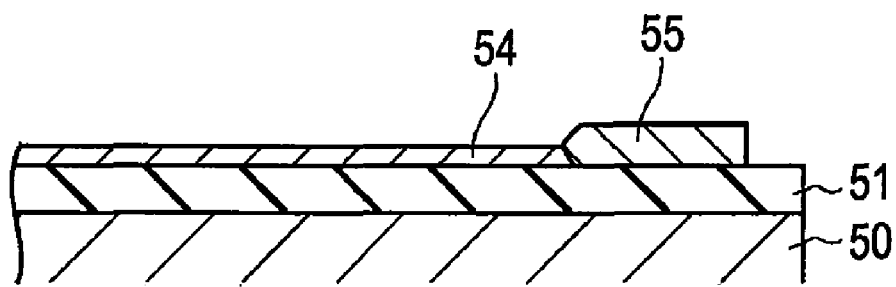
Figure 14A:
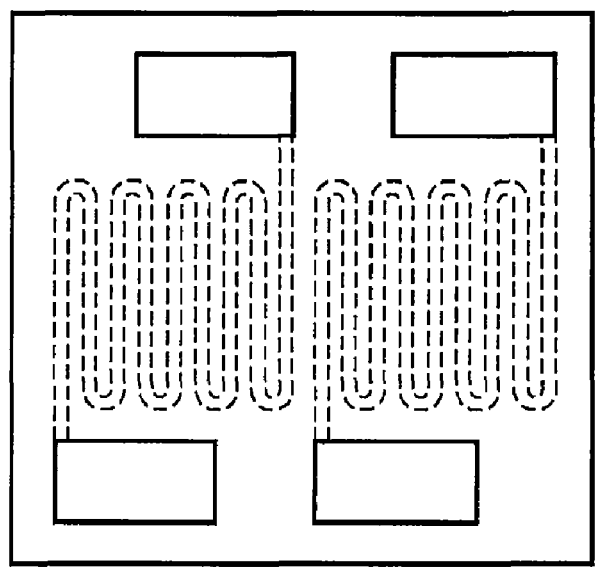
FIGS. 14A and 14B illustrate a step performed after the step illustrated in FIGS. 13A and 13B.
Figure 14B:
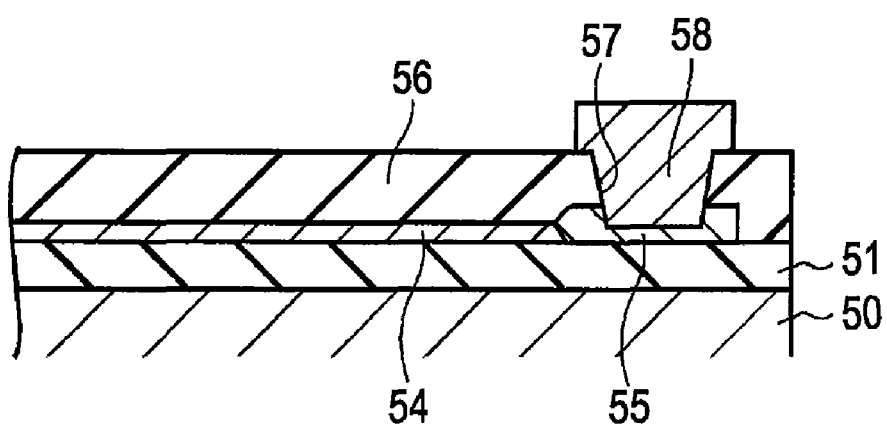

A method for producing the magnetic sensor 1 according to the present embodiment will be described with reference to FIGS. 9A to 11B (FIGS. 2 and 3 are also used). FIGS. 9A, 10A, and 11A are plan views of the magnetic sensor 1. FIGS. 9B, 10B, and 11B are partial sections taken along line IXB-IXB illustrated in FIG. 9A and lines corresponding to line IXB-IXB in the film thickness direction and viewed in the direction of arrows. FIGS. 9A to 11B illustrate steps for producing the magnetoresistive elements 2 and 3 illustrated in FIG. 7.

In the step illustrated in FIGS. 9A and 9B, the insulation layer 17 is formed on the substrate 16 by sputtering or the like; and the element sections 12 and the extension regions 13 that constitute the magnetoresistive elements 2 and 3 are integrally formed on the insulation layer 17 so as to have the layer configuration illustrated in FIG. 6, the extension regions 13 extending from the two ends of each element section 12 in the longitudinal direction. The element sections 12 and the extension regions 13 are patterned by a photolithographic technique such that the element sections 12 have a meandering shape and the extension regions 13 include the electrode sections 13a having a large width.

In the step illustrated in FIGS. 10A and 10B, the insulation layer 18 is formed on the element sections 12 and the extension regions 13 by sputtering or the like. The insulation layer 18 is formed over the entire region above the substrate 16. The insulation layer 18 is formed so as to have a sufficiently large film thickness compared with the element sections 12 and the extension regions 13 (refer to FIG. 3).

The insulation layer 18 functions as a protective layer for protecting the element sections 12 and the extension regions 13 during the production process. For example, the production process can be performed in which, without forming the insulation layer 18, the subsequent steps including the formation of the electrode pads are conducted. However, when the element sections 12 and the extension regions 13 are left exposed without forming the insulation layer 18, the element sections 12 and the extension regions 13 are directly subjected to the subsequent steps, leading to degradation of characteristics or variation in characteristics, which is not preferable. In addition, an insulating protective layer is ultimately provided on the element sections 12, which increases the number of production steps and complicates the production process. Accordingly, after the formation of the element sections 12 and the extension regions 13 and before the formation of the electrode pads, the element sections 12 and the extension regions 13 are covered with and protected by the insulation layer 18.

Then, the contact holes 19 continuously penetrating through the insulation layer 18 and the electrode sections 13a that have a large width and constitute the extension regions 13 are formed by ion milling (etching). The contact holes 19 are formed in the following manner. A resist layer (not shown) is formed on the insulation layer 18. A pattern having openings corresponding to the contact holes 19 is formed in the resist layer. Portions of the insulation layer 18 and the extension regions 13 exposed through the openings of the pattern are removed by ion milling (etching).

In this ion milling, the angle of the milling is preferably adjusted such that angle □1 formed between a side surface of the contact holes 19 and the plane of the substrate is in the range of 15° to 85°. As a result, the seed layer 20 described below can be appropriately formed on the side surfaces of the contact holes 19; and the contact holes 19 continuously penetrating through the insulation layer 18 and the extension regions 13 are appropriately formed by overetching. As illustrated in FIG. 2, the contact holes 19 are substantially formed at the centers of the electrode sections 13a of the extension regions 13, the electrode sections 13a having a large width. Thus, the electrode sections 13a are left so as to surround the contact holes 19.

Then, the seed layer 20 is formed over the entire region including the inner surfaces of the contact holes 19 and the top surface of the insulation layer 18 (refer to FIG. 3; however, FIG. 3 illustrates the state in which the seed layer 20 formed on the insulation layer 18 has been removed).

Then, a resist layer (not shown) is formed on the insulation layer 18. A pattern for forming the electrode pads 21, the pattern having openings corresponding to the positions of the contact holes 19, is formed in the resist layer. The electrode pads 21 are subsequently formed of Au, Al, or the like by plating in the openings of the pattern. The resist layer is then removed and the seed layer 20 on the insulation layer 18 around the electrode pads 21 is removed by etching or the like.

The above-described method for producing the magnetic sensor 1 according to the present embodiment does not require the electrode formation step that has been performed for connecting electrode layers to the two ends of each element section 12, the step having been performed as a step independent from the step of forming the element sections 12. Thus, the present embodiment allows simplification of the production process. In addition, since the present embodiment does not require the formation of electrode layers composed of a good conductor, the formation having been performed, the present embodiment allows reduction in production costs. In addition, in the present embodiment, the element sections 12 and the extension regions 13 are integrally formed; the contact holes 19 continuously penetrating through the insulation layer 18 and the extension regions 13 are formed by overetching, and the electrode pads 21 are formed so as to fill the contact holes 19. As a result, the connection between the electrode pads 21 and the element sections 12 can be stabilized by the production process that is simpler than that of existing techniques.

As illustrated in FIG. 9A, the electrode sections 13*a* having a large width are formed in the extension regions 13. The contact holes 19 are substantially formed at the centers of the electrode sections 13*a*. Thus, as illustrated in FIG. 2, portions of the electrode sections 13*a* can be appropriately left around the contact holes 19; and the side surfaces 21*a* of the electrode pads 21 can be appropriately, readily, and electrically connected to the inner side surfaces 13*a*1 of the electrode sections 13*a*. Accordingly, the connection between the electrode pads 21 and the element sections 12 can be stabilized more effectively.

The fixed resistance elements 4 and 5 can be formed in a manner similar to the production steps illustrated in FIGS. 9A to 11B.

What is claimed is:

1. A magnetic sensor comprising:
   a magnetoresistive element,
   wherein the magnetoresistive element includes, in plan view, an element section and an extension region extending from an end portion of the element section; and an insulation layer is formed on the element section and the extension region;
   a contact hole having a recessed shape, penetrating through the insulation layer, and extending at least to the extension region is formed; an electrode pad is formed in the contact hole; a surface of the electrode pad is exposed to outside; and the electrode pad is electrically connected to the extension region; and
   the element section and the extension region are integrally formed so as to have an identical multilayer configuration employing a magnetoresistive effect in which electrical resistance varies in response to external magnetic fields;
   wherein a tip portion of the extension region is formed so as to surround the contact hole; and an inner side surface of the extension region is electrically connected to a side surface of the electrode pad formed in the contact hole.

2. A magnetic sensor comprising:
   a magnetoresistive element employing a magnetoresistive effect in which electrical resistance varies in response to external magnetic fields; and
   a fixed resistance element in which electrical resistance does not vary in response to external magnetic fields, the fixed resistance element being connected in series to the magnetoresistive element via an output extracting section,
   wherein the magnetoresistive element and the fixed resistance element each include, in plan view, an element section and an extension region extending from an end portion of the element section; and an insulation layer is formed on the element section and the extension region; and
   in at least one of the magnetoresistive element and the fixed resistance element, the element section and the extension region are integrally formed so as to have an identical layer configuration; a contact hole having a recessed shape, penetrating through the insulation layer, and extending at least to the extension region is formed; an electrode pad is formed in the contact hole; a surface of the electrode pad is exposed to outside; and the electrode pad is electrically connected to the extension region.

3. The magnetic sensor according to claim 1, wherein the element section is formed so as to have a meandering shape.

4. The magnetic sensor according to claim 1, wherein the contact hole formed in the magnetoresistive element does not penetrate through the extension region; and, under the contact hole, a portion of the extension region is left in which at least a magnetic sensitive layer whose magnetization varies in response to external magnetic fields has been removed.

5. A method for producing a magnetic sensor including a magnetoresistive element, the method comprising the steps of:
   forming the magnetoresistive element so as to include, in plan view, an element section and an extension region extending from an end portion of the element section; the element section and the extension region being integrally formed so as to have an identical multilayer configuration employing a magnetoresistive effect in which electrical resistance varies in response to external magnetic fields;
   forming an insulation layer on the element section and the extension region;
   forming a contact hole having a recessed shape, penetrating through the insulation layer, and extending at least to the extension region; and
   forming an electrode pad in the contact hole such that a surface of the electrode pad is exposed to outside and the electrode pad is electrically connected to the extension region;
   wherein an electrode section having a larger width than the extension region is formed at a tip of the extension region; and the contact hole is formed within a region of the electrode section such that a portion of the electrode section is left around the contact hole to electrically connect a side surface of the electrode pad formed in the contact hole to an inner side surface of the electrode section.

6. A method for producing a magnetic sensor including a magnetoresistive element employing a magnetoresistive effect in which electrical resistance varies in response to external magnetic fields; and a fixed resistance element in which electrical resistance does not vary in response to external magnetic fields, the fixed resistance element being connected in series to the magnetoresistive element via an output extracting section, the method comprising the steps of:
   forming each of the magnetoresistive element and the fixed resistance element so as to include, in plan view, an element section and an extension region extending from an end portion of the element section; in at least one of the magnetoresistive element and the fixed resistance element, the element section and the extension region being integrally formed so as to have an identical layer configuration;
   forming an insulation layer on the element section and the extension region;
   forming, in the element including the element section and the extension region that are integrally formed so as to have the identical layer configuration, a contact hole having a recessed shape, penetrating through the insulation layer, and extending at least to the extension region; and
   forming an electrode pad in the contact hole such that a surface of the electrode pad is exposed to outside and the electrode pad is electrically connected to the extension region.

7. The method according to claim 5, wherein the element section is formed so as to have a meandering shape.

* * * * *